United States Patent
Keen et al.

(10) Patent No.: US 9,638,079 B2
(45) Date of Patent: May 2, 2017

(54) EXHAUST MIXER, EMISSIONS CLEANING MODULE AND METHOD

(71) Applicant: Perkins Engines Company Limited, Cambridgeshire (GB)

(72) Inventors: Andrew Keen, Cambridgeshire (GB); Naseer A. Niaz, Cambridgeshire (GB); Swapnil Padate, Cambridgeshire (GB); Anthony Rodman, Peoria, IL (US); David Phillips, Lincolnshire (GB)

(73) Assignee: Perkins Engines Company Limited, Peterborough (GB)

( * ) Notice: Subject to any disclaimer, the term of this patent is extended or adjusted under 35 U.S.C. 154(b) by 46 days.

(21) Appl. No.: 14/395,012

(22) PCT Filed: Feb. 14, 2013

(86) PCT No.: PCT/GB2013/050352
§ 371 (c)(1),
(2) Date: Oct. 16, 2014

(87) PCT Pub. No.: WO2013/160648
PCT Pub. Date: Oct. 31, 2013

(65) Prior Publication Data
US 2015/0101311 A1    Apr. 16, 2015

Related U.S. Application Data

(63) Continuation-in-part of application No. PCT/GB2012/053063, filed on Dec. 7, 2012.

(30) Foreign Application Priority Data

Apr. 24, 2012    (GB) .................................... 1207201.3

(51) Int. Cl.
*F01N 13/08*    (2010.01)
*F01N 3/20*    (2006.01)
(Continued)

(52) U.S. Cl.
CPC ........... *F01N 3/20* (2013.01); *B01D 46/0002* (2013.01); *B01D 46/0057* (2013.01);
(Continued)

(58) Field of Classification Search
CPC .... F01N 1/086; F01N 3/2066; F01N 2240/20; F01N 2610/02; F01N 2610/1453;
(Continued)

(56) References Cited

U.S. PATENT DOCUMENTS

2002/0108368 A1*   8/2002  Hodgson ............ B01D 53/9431
                                                                60/286
2007/0204751 A1*   9/2007  Wirth et al. ..................... 96/290
(Continued)

FOREIGN PATENT DOCUMENTS

CN    101539046    9/2009
CN    102084103    6/2011
(Continued)

OTHER PUBLICATIONS

European Patent Office, International Search Report in International Patent Application No. PCT/GB2013/050352, Jun. 19, 2013, 3 pp.

*Primary Examiner* — Jorge Leon, Jr.

(57) ABSTRACT

An exhaust mixer provided may be used for mixing an additive, such as urea, in exhaust fluid flow. The exhaust mixer may be useful in reducing or preventing build-up of solid additive deposits by increasing efficiency of mixing of the additive. The exhaust mixer may be located at least partially within a mixing conduit and includes plurality of elongate mixing blades held in spaced configuration by a support. Each mixing blade may have a longitudinal axis extending along a longitudinal axis of the mixing conduit, wherein an injector module may be located upstream of the inlet of the mixing conduit.

17 Claims, 8 Drawing Sheets

(51) Int. Cl.
| | |
|---|---|
| F01N 3/28 | (2006.01) |
| F01N 13/00 | (2010.01) |
| F01N 13/14 | (2010.01) |
| F01N 13/18 | (2010.01) |
| F01N 3/021 | (2006.01) |
| F01N 3/02 | (2006.01) |
| F01N 3/023 | (2006.01) |
| G01M 15/10 | (2006.01) |
| B60R 13/08 | (2006.01) |
| B01D 46/00 | (2006.01) |
| F01N 3/08 | (2006.01) |
| B01D 53/86 | (2006.01) |
| F01N 3/035 | (2006.01) |
| B01D 53/92 | (2006.01) |
| F01N 9/00 | (2006.01) |
| H05K 5/02 | (2006.01) |
| H05K 7/20 | (2006.01) |
| B01F 5/06 | (2006.01) |
| F01N 1/08 | (2006.01) |

(52) U.S. Cl.
CPC ........... *B01D 53/864* (2013.01); *B01D 53/92* (2013.01); *B60R 13/0876* (2013.01); *F01N 3/02* (2013.01); *F01N 3/021* (2013.01); *F01N 3/0233* (2013.01); *F01N 3/035* (2013.01); *F01N 3/08* (2013.01); *F01N 3/28* (2013.01); *F01N 3/2892* (2013.01); *F01N 9/00* (2013.01); *F01N 13/00* (2013.01); *F01N 13/008* (2013.01); *F01N 13/08* (2013.01); *F01N 13/14* (2013.01); *F01N 13/143* (2013.01); *F01N 13/18* (2013.01); *F01N 13/1805* (2013.01); *G01M 15/102* (2013.01); *H05K 5/02* (2013.01); *H05K 7/20436* (2013.01); *B01F 5/0613* (2013.01); *B01F 2005/0621* (2013.01); *B01F 2005/0636* (2013.01); *F01N 1/086* (2013.01); *F01N 2240/20* (2013.01); *F01N 2260/022* (2013.01); *F01N 2260/20* (2013.01); *F01N 2450/22* (2013.01); *F01N 2470/04* (2013.01); *F01N 2490/06* (2013.01); *F01N 2610/1453* (2013.01); *Y10T 29/49345* (2015.01)

(58) Field of Classification Search
CPC ..... B01F 5/0613; B01F 5/0616–5/0619; B01F 2005/0621; B01F 2005/0636; B01F 2215/0422
USPC .......................... 60/274, 301, 310, 317, 324
See application file for complete search history.

(56) References Cited

U.S. PATENT DOCUMENTS

| | | | |
|---|---|---|---|
| 2007/0245718 A1* | 10/2007 | Cheng et al. .................... | 60/286 |
| 2008/0295497 A1* | 12/2008 | Kornherr et al. ............... | 60/286 |
| 2009/0139219 A1 | 6/2009 | Saget | |
| 2009/0262599 A1* | 10/2009 | Kohrs ................... | B01F 5/0643 366/337 |
| 2009/0320453 A1* | 12/2009 | Salanta et al. .................. | 60/282 |
| 2010/0132344 A1* | 6/2010 | Peters ............................. | 60/299 |
| 2010/0293931 A1* | 11/2010 | Peters et al. .................... | 60/324 |
| 2011/0146254 A1* | 6/2011 | Yi et al. .......................... | 60/310 |
| 2011/0258983 A1* | 10/2011 | Vosz ................................ | 60/274 |
| 2011/0283686 A1* | 11/2011 | Jebasinski ....................... | 60/295 |
| 2012/0211116 A1* | 8/2012 | Young ............................. | 138/103 |
| 2012/0227390 A1* | 9/2012 | Wikaryasz et al. .............. | 60/324 |
| 2012/0320708 A1* | 12/2012 | Geibel ............................. | 366/337 |
| 2013/0104531 A1* | 5/2013 | Cho et al. ........................ | 60/302 |

FOREIGN PATENT DOCUMENTS

| | | |
|---|---|---|
| DE | 102007012790 A1 | 9/2008 |
| EP | 0722040 | 7/1996 |
| EP | 2474721 | 7/2012 |
| WO | WO 2009/157995 A1 | 12/2009 |

* cited by examiner

EXHAUST MIXER, EMISSIONS CLEANING MODULE AND METHOD

CROSS-REFERENCE TO RELATED APPLICATIONS

This patent application is a national phase application of PCT/GB2013/050352 filed Feb. 14, 2013, which is a continuation-in-part of PCT/GB2012/053063 filed Dec. 7, 2012, both of which claim priority to GB application 1207201.3 filed Apr. 24, 2012.

TECHNICAL FIELD

The disclosure relates to an apparatus for cleaning exhaust fluids emitted during the operation of combustion engines. In particular, it relates to an exhaust mixer, an emissions cleaning module comprising such an exhaust mixer and a method of mixing an additive into an exhaust fluid.

BACKGROUND

Engines, for example IC engines burning gasoline, diesel or biofuel, output various harmful substances which must be treated to meet current and future emissions legislation. Most commonly those substances comprise hydrocarbons (HC), carbon monoxides (CO), mono-nitrogen oxides (NOx) and particulate matter, such as carbon (C), a constituent of soot. Some of those substances may be reduced by careful control of the operating conditions of the engine, but usually it is necessary to provide apparatus, such as an emissions cleaning module, downstream of the engine to treat at least some of those substances entrained in the exhaust fluid. Various apparatus for reducing and/or eliminating constituents in emissions are known. For example, it is known to provide an oxidation device, such as a diesel oxidation catalyst, to reduce or to eliminate hydrocarbons (HC) and/or carbon monoxide (CO). Oxidation devices generally include a catalyst to convert those substances into carbon dioxide and water, which are significantly less harmful. As a further example, emissions cleaning modules may include a particulate filter to restrict the particulates present in the exhaust gas from being output to atmosphere.

By use of an emissions cleaning module, engine emissions can be cleaned, meaning that a proportion of the harmful substances which would otherwise be released to atmosphere are instead converted to carbon dioxide ($CO_2$), nitrogen ($N_2$) and water ($H_2O$).

In addition, it is known to reduce or eliminate mono-nitrogen oxides (NOX) in diesel combustion emissions by conversion to diatomic nitrogen ($N_2$) and water ($H_2O$) by catalytic reaction with chemicals such as ammonia ($NH_3$) entrained in the exhaust gas.

Generally ammonia is not present in exhaust fluids and must therefore be introduced upstream of a catalyst, typically by injecting a urea solution into the exhaust gas which decomposes into ammonia at sufficiently high temperatures.

By these methods, engine fluids can be cleaned, meaning that a proportion of the harmful substances which would otherwise be released to atmosphere are instead converted to carbon dioxide ($CO_2$), nitrogen ($N_2$) and water ($H_2O$).

Exhaust systems, which may include an emissions cleaning module, may therefore comprise an injector module for injecting a fluid, such as urea, into the exhaust fluid flow. It is also known to include an exhaust mixer to aid mixing of the injected urea with the exhaust fluid flow. For example, WO2011/062960 describes an exhaust mixer provided for use in an engine exhaust system, wherein the exhaust mixer comprises a plurality of vanes arranged in an equally spaced array around a central axis. The exhaust mixer acts to create turbulence within the exhaust flow with an aim of improving the mixing of the urea with the exhaust fluid flow.

Against this background there is provided an emissions cleaning module comprising an improved arrangement of exhaust mixer, an improved engine exhaust system comprising an exhaust mixer and an improved method of mixing an additive into an exhaust fluid.

SUMMARY OF THE DISCLOSURE

The present disclosure provides an exhaust mixer comprising:
  a plurality of elongate mixing blades;
  a support configured to hold the plurality of elongate mixing blades in a spaced relationship to one another;
  the support being locatable in, or forming a part of, an emissions cleaning module or exhaust conduit.

The present disclosure also provides an emissions cleaning module comprising an exhaust mixer as just described.

The present disclosure also provides a method of mixing an additive into an exhaust fluid comprising the steps of:
  passing a flow of exhaust fluid along a mixing conduit having an inlet, an outlet and a longitudinal axis;
  injecting into the flow of exhaust fluid an additive spray from an injector module; and
  passing the flow of exhaust fluid and additive spray through an exhaust mixer located at least partially within the mixing conduit;
  wherein the exhaust mixer comprises a plurality of elongate mixing blades arranged in a spaced arrangement for turbulently mixing the additive spray with the exhaust fluid;
  each elongate mixing blade having a longitudinal axis extending along the longitudinal axis of the mixing conduit;
  wherein the additive spray is injected into the inlet of the mixing conduit by the injector module.

BRIEF DESCRIPTION OF THE DRAWINGS

Embodiments of the present disclosure will now be described, by way of example only, with reference to the accompanying drawings in which.

DETAILED DESCRIPTION

Figure 7:
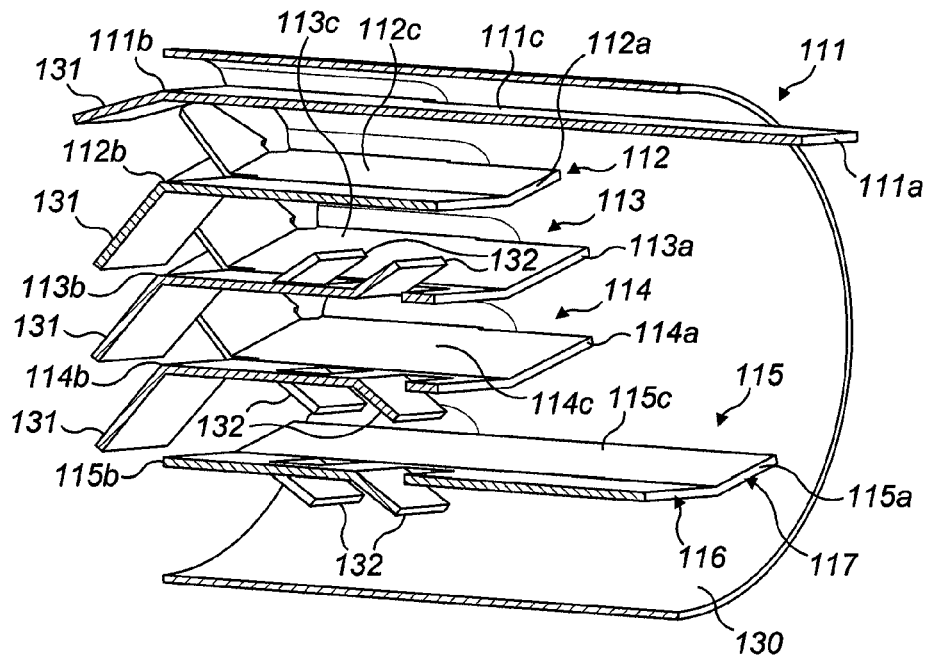
FIG. 7 shows a perspective cross-section of the exhaust mixer of FIG. 4.
Figure 8:
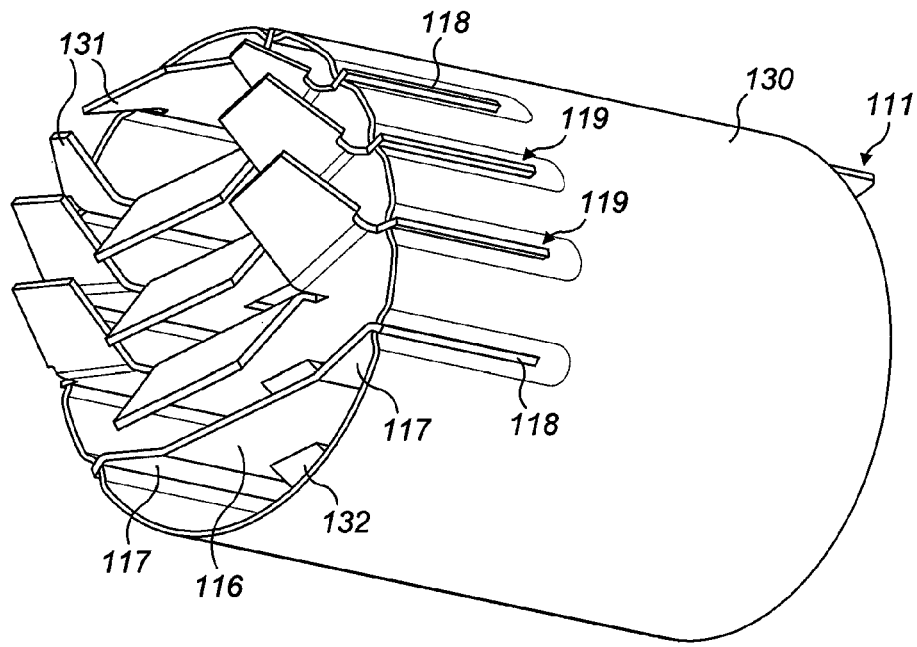
FIG. 8 shows a perspective view of the exhaust mixer of FIG. 7.

A first embodiment of exhaust mixer 100 of the present disclosure is shown in FIGS. 7 and 8. The exhaust mixer 100 may form a component part of an engine exhaust system. The exhaust mixer 100 may form a component part of an emissions cleaning module, which itself may form a part of an engine exhaust system. In the following description the exhaust mixer 100 will be described, by way of example only, as forming a component part of an emissions cleaning module.

Figure 1:
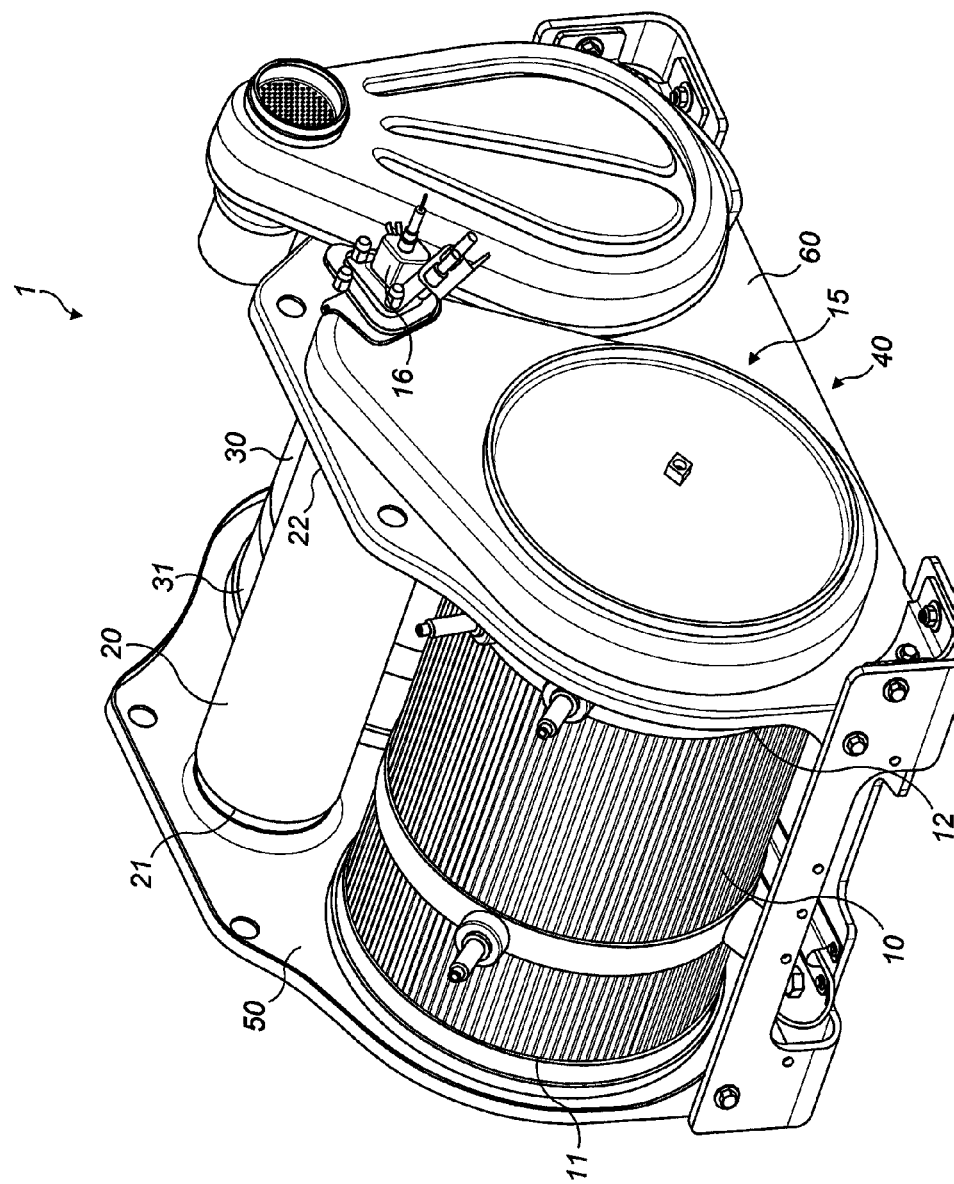
FIG. 1 shows an emissions cleaning module in accordance with the present disclosure.
Figure 2:
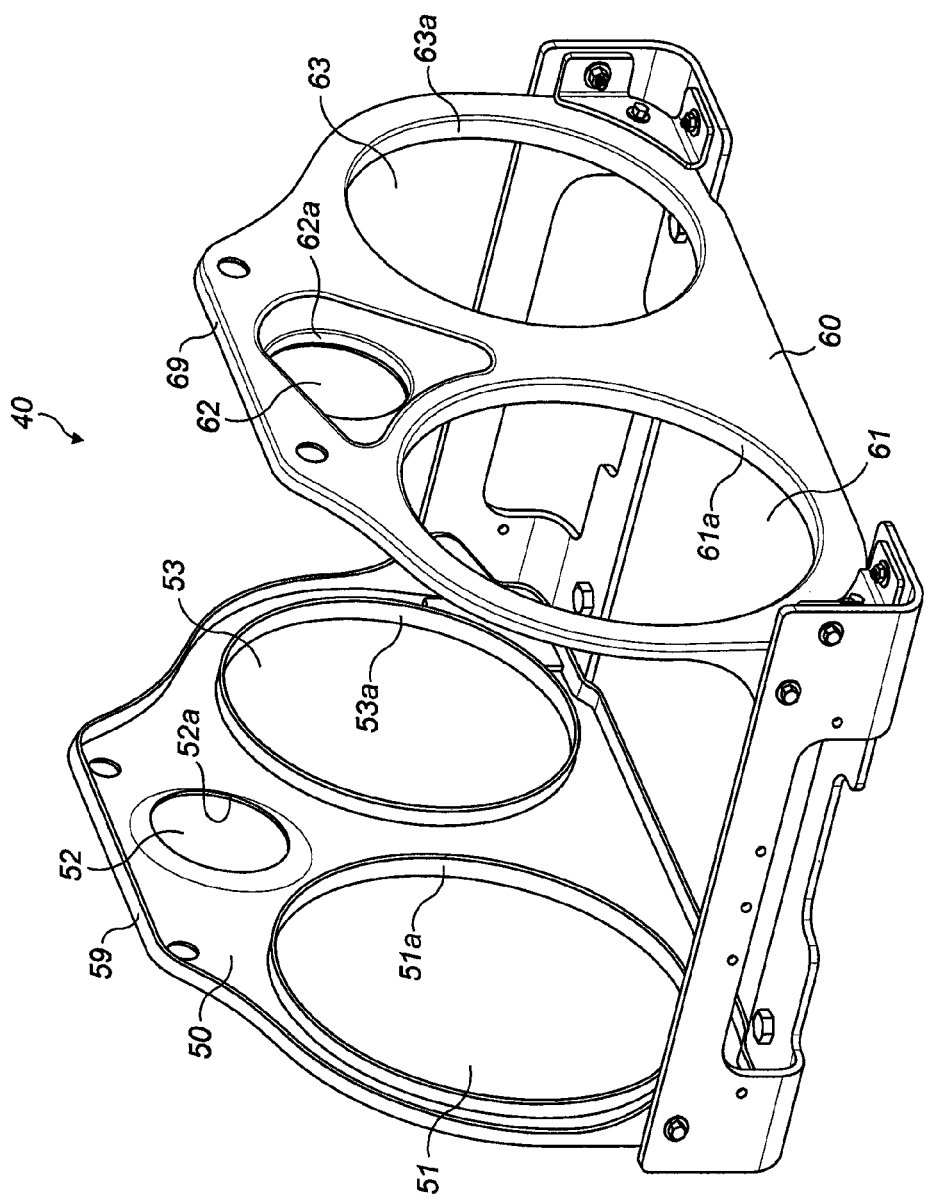
FIG. 2 shows a support frame of the emissions cleaning module of FIG. 1.

The general structure of an example of the emissions cleaning module 1, is shown in FIG. 1, and may comprise a first conduit 10 and a second conduit 20. A third conduit 30 and a support structure 40 may also be present. The support structure 40, as shown in FIG. 2, may comprise a first support member 50 and a second support member 60.

Each support member 50, 60 may be generally planar and may be of rigid material, for example metal.

The first, second and third conduits 10, 20, 30 may be elongate, having an axis of elongation, and may have a substantially constant cross-section along the axis of elongation. The first, second and third conduits 10, 20, 30 may be substantially cylindrical.

The first conduit 10 may comprise a first end 11 providing an inlet to the conduit and a second end 12 providing an outlet to the conduit. The second conduit 20 may comprise a first end 21 providing an outlet to the conduit and a second end 22 providing an inlet to the conduit. The third conduit 30 may comprise a first end 31 providing an inlet to the conduit and a second end providing an outlet to the conduit.

The first, second and third conduits 10, 20, 30 may extend between the support members 50, 60. The first, second and third conduits 10, 20, 30 may be generally substantially parallel. The first ends 11, 21, 31 of the first, second and third conduits 10, 20, 30 may be received in and may be shaped to correspond with first, second and third openings 51, 52, 53, respectively, of the first support member 50. The second ends 12, 22 of the first, second and third conduits 10, 20, 30 may be received in and may be shaped to correspond with first, second and third openings 61, 62, 63, respectively, of the second support member 60. By this arrangement, lateral movement of the conduits may be restricted.

As shown in FIG. 2, each opening 51, 52, 53, 61, 62, 63 may comprise a flange 51a, 52a, 53a, 61a, 62a, 63a extending around a perimeter of the opening. Each support member 50, 60 may further comprise an inwardly turned lip 59, 69 extending at least part way around a periphery of the support member 50, 60.

The first, second and third conduits 10, 20, 30 may all be of substantially similar length. The first conduit 10 may have a first diameter, the second conduit 20 may have a second diameter and the third conduit 30 may have a third diameter. The second diameter may be smaller than the first and third diameters.

The first and second ends 11, 21, 31, 12, 22 of the first, second and third conduits 10, 20, 30 may be welded, adhered or otherwise secured to portions of the support members 50, 60 defining or surrounding the openings. Alternatively, first and second ends 11, 21, 31, 12, 22 of the first, second and third conduits 10, 20, 30 may abut the inner sides of the support members 50, 60 so as to overlie respective openings in the support members 50, 60.

The first, second and third conduits 10, 20, 30 and the first and second support members 50, 60 may be interconnected in a manner which restricts relative translational movement of those components. Instead or in addition, the first, second and third conduits 10, 20, 30 and the first and second support members 50, 60 may be interconnected in a manner which restricts rotational movement of one component with respect to another.

The first conduit 10 may be fluidly coupled to the second conduit 20 via a first end coupling 15 which may fluidly conned the outlet of the first conduit 10 to the inlet of the second conduit 20. The second conduit 20 may be coupled to the third conduit 30 via a second end coupling 25 for fluidly connecting the outlet of the second conduit 20 to the inlet of the third conduit 30. Each of the first and second end couplings may define, in combination with its respective support member, a fluid flow path through which exhaust fluid, for example exhaust gas, may pass between adjacent conduits.

Within the fluid flow path of the emissions cleaning module there may be located a diesel oxidation catalyst (DOC) module 71, a diesel particulate filter (DPF) module 70, a selective catalyst reduction (SCR) module and an ammonia oxidation catalyst (AMOX) module. The fluid flow path is also provided with a mixing conduit 75 and an injector module 16, the function of which will be described further below.

The DOC module 71 may be located in a first portion of the first conduit 10 towards the first end 11, forming the inlet of the first conduit 10. The DPF module 70 may be located in a second portion of the first conduit 10 towards the second end 12 forming the outlet of the first conduit 10. The first end coupling 15 may provide a fluid flow path from the second end 12 of the first conduit 10 to the second end 22 of the second conduit 20.

The SCR module may be located in a first portion of the third conduit 30 towards the first end 31 of the third conduit 30. The SCR module may comprise a catalyst surface intended to cause a catalytic reaction between the two fluids mixed in the mixing conduit and output by the diffuser. The AMOX module may be located in a second portion of the third conduit 30 towards the second end of the third conduit 30. The AMOX module may comprise a catalyst which may catalyse a reaction of one or more of the products output from the SCR module.

Figure 3:
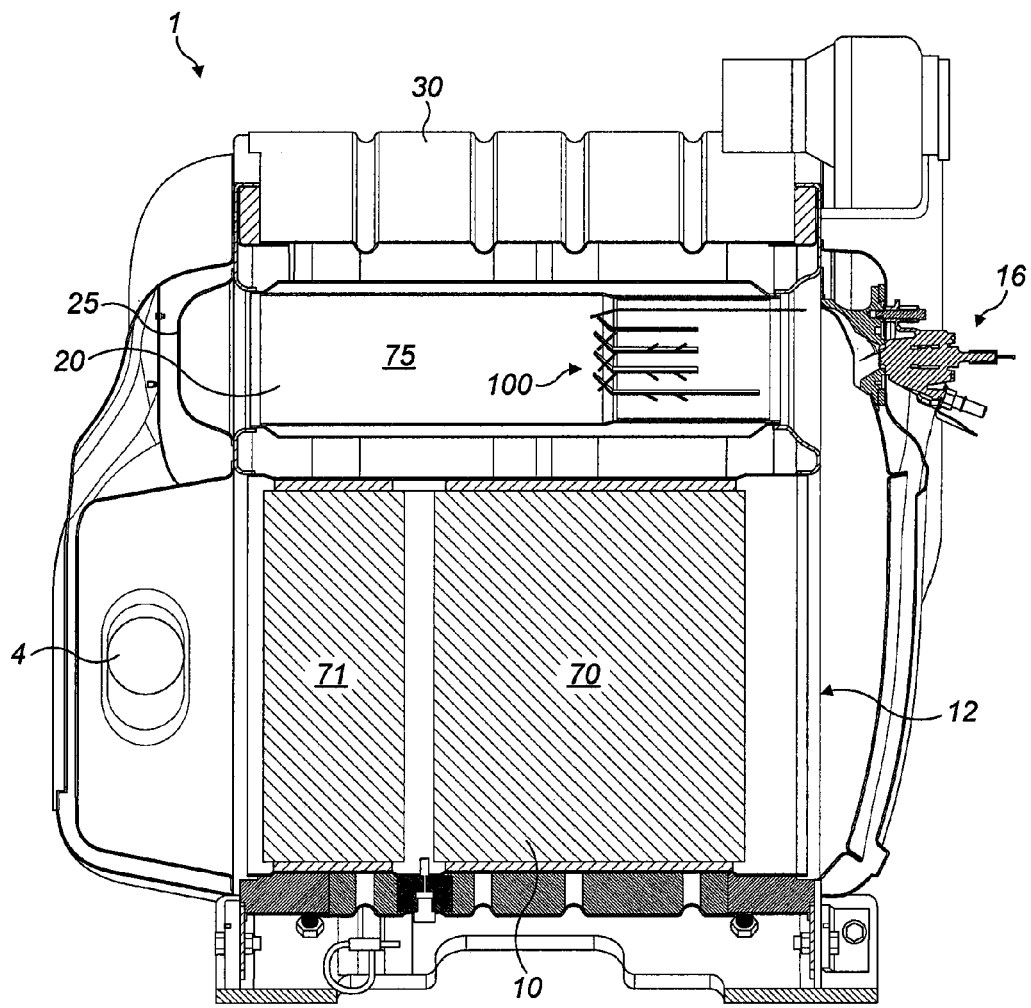
FIG. 3 shows a partial cross-section of the emissions cleaning module of FIG. 1.
Figure 4:
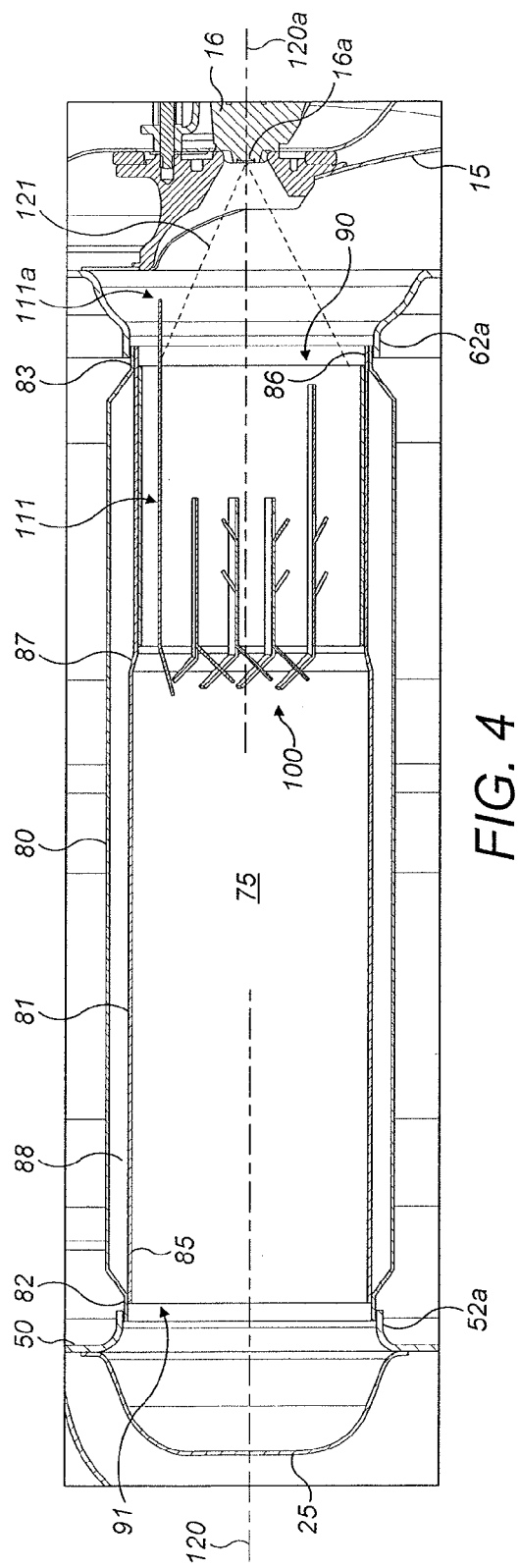
FIG. 4 shows a cross-section of a mixing conduit of the emissions cleaning module of FIG. 1 containing a first embodiment of exhaust mixer.
Figure 5:
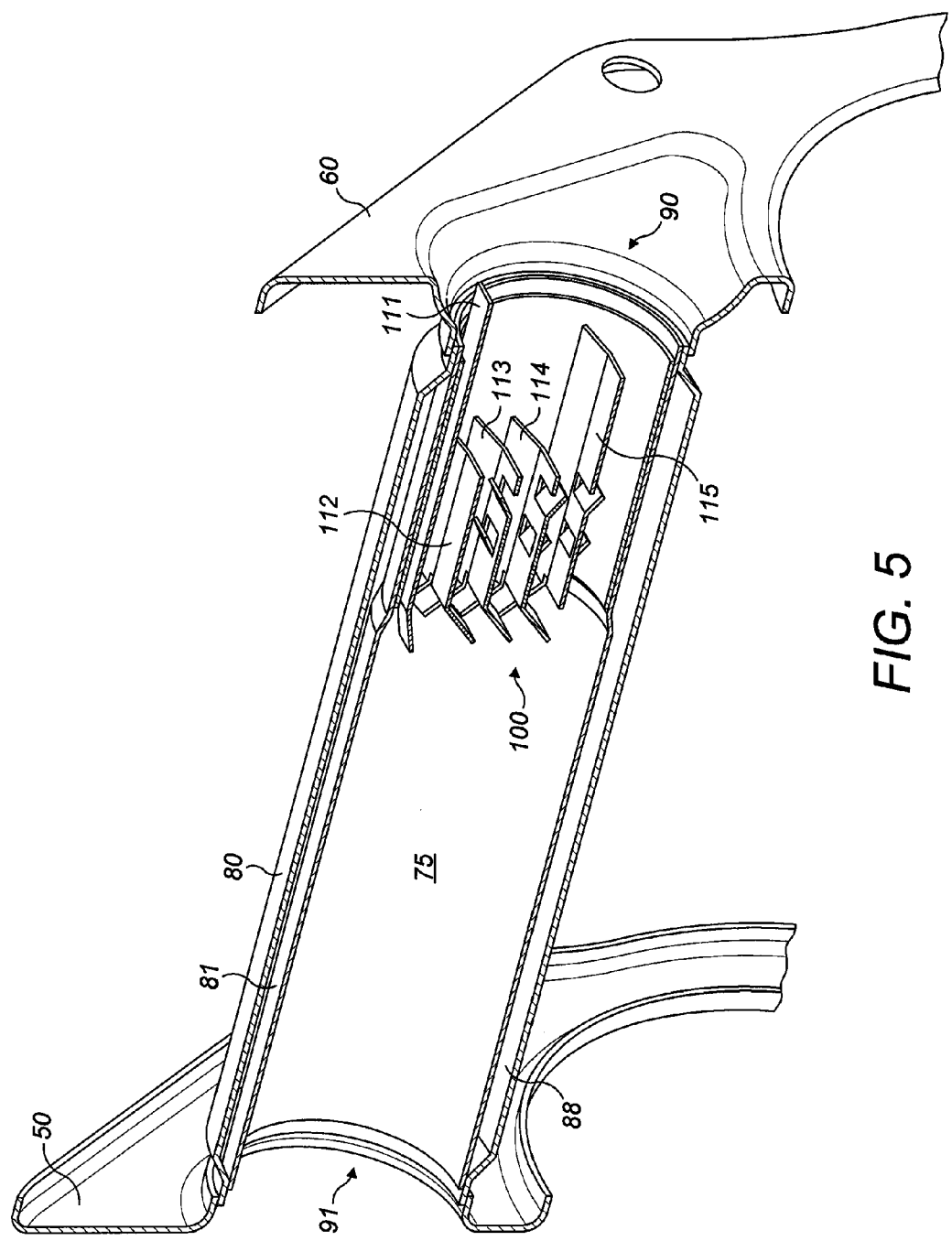
FIG. 5 shows a perspective cross-section of the mixing conduit of FIG. 4.

The mixing conduit 75 may be located in, or formed by, the second conduit 20. As shown in FIGS. 3 and 4, the mixing conduit 75 comprises an inlet 90, an outlet 91 and has a longitudinal axis 120. The mixing conduit 75 may comprise an outer body 80 and an inner body 81 located within the outer body 80. The outer body 80 may form the external skin of the second conduit 20. An air gap 88 may be provided between the inner body 81 and the outer body 80.

The outer body 80 may be elongate and extend between the first support member 50 and the second support member 60. The outer body 80 may be cylindrical and may have a constant diameter except at the ends therefore which may have a smaller diameter. A first end 82 of the outer body 80 may be fixedly retained to the first support member 50. The fixation may be by means of a weld between the first end 82 and the flange 52a. The connection may be to an inner or outer face of the flange 52a. A second end 83 of the outer body 80 may be fixedly retained to the second support member 60. The fixation may be by means of a weld between the second end 83 and the flange 62a. The connection may be to an inner or outer face of the flange 62a.

The inner body 81 may be elongate. The inner body 81 may be cylindrical and may have a constant diameter. Alternatively, as shown, it may have a tapered section 87 leading to one end having a smaller diameter than the other. A first end 85 of the inner body 81 may be slidingly retained within the outer body 80. The first end 85 of the inner body 81 may be slidingly retained in contact with the first end 82 of the outer body 80. The first end 85 of the inner body 81 may form a slidable fit within the first end 82 of the outer body 80. A second end 86 of the inner body 81 may be fixedly retained relative to the outer body 80 at or near the second support member 60. The fixation may be by means of a weld between the second end 86 and the outer body 80. Alternatively, the fixation may be by means of a weld between the second end 86 and the second support member 60. A single weld may be used to join the second end 86 of the inner body 81, the second end 83 of the outer body 80 and the second support member 60.

Thus, at the second end the inner body 81, outer body 80 and second support member 60 may be prevented from moving axially relative to one another. However, at the first end the inner body 81 may be free to move axially relative to the outer body 80.

As shown in FIG. 4, the injector module 16 is located upstream of the inlet 90 of the mixing conduit 75 with an outlet 16a of the injector module 16 being configured to inject an additive into the inlet 90 of the mixing conduit 75. The injector module 16 may be mounted in the first end coupling 15. As shown in FIG. 4, the outlet 16a of the injector module 16 may be located on, or proximate to, an extension 120a of the longitudinal axis 120 of the mixing conduit 75.

The outlet 16a of the injector module 16 may be configured to inject an additive, for example urea, as a spray having a spray pattern centred along, or parallel to, the longitudinal axis 120 of the mixing conduit 75.

According to the present disclosure, the exhaust mixer 100 may be located at least partially within the mixing conduit 75 downstream of the injector module 16.

Figure 6:
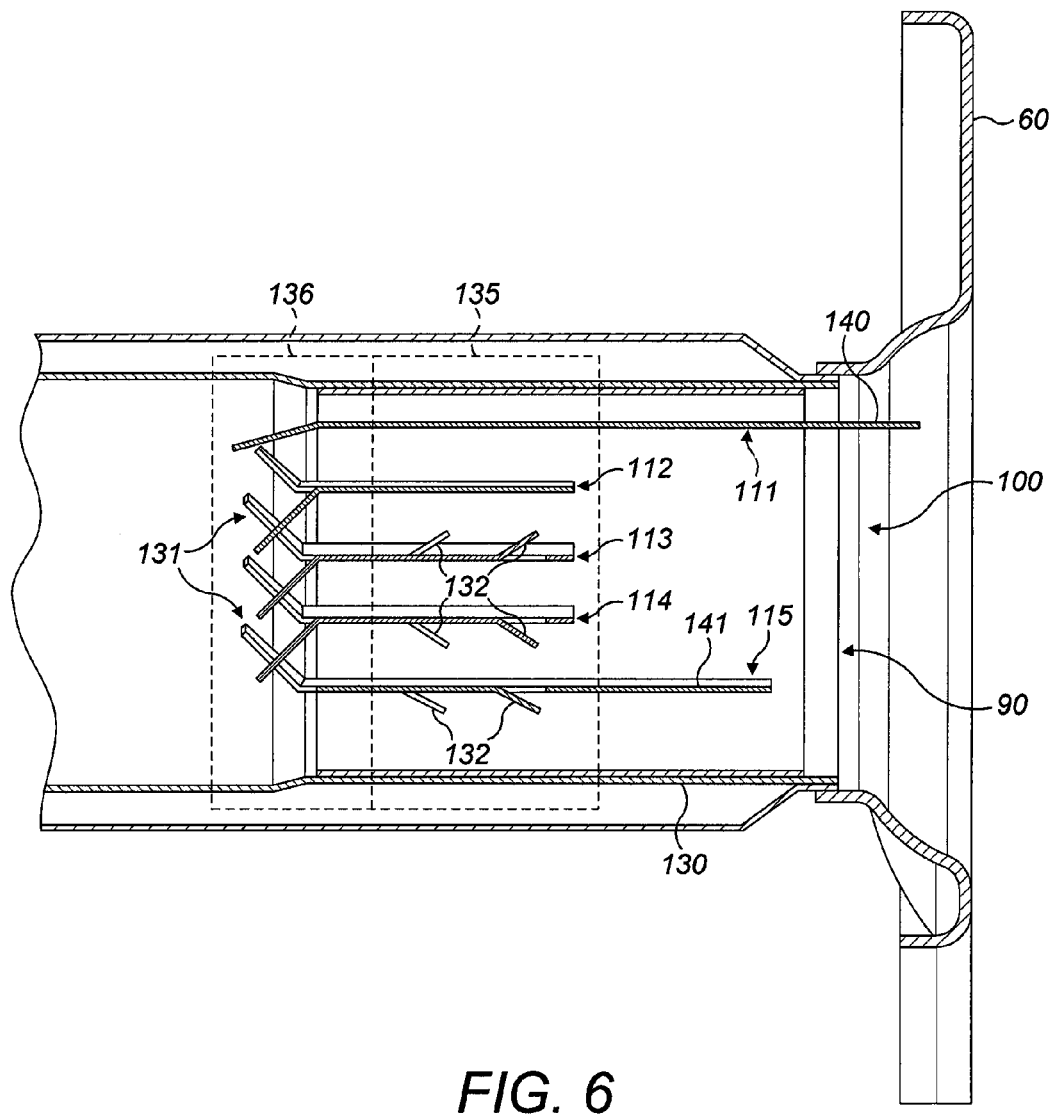
FIG. 6 shows a cross-section of a part of the mixing conduit of FIG. 4.

As shown in FIG. 6, a first embodiment of the exhaust mixer 100 comprises a plurality of elongate mixing blades 111-115 which may be arranged in a stacked and spaced relationship such that there may be no direct contact between neighbouring elongate mixing blades. The elongate mixing blades 111-115 may be mounted in an exhaust mixer support 130 or other support means as shown most clearly in FIG. 8 which is configured to hold the plurality of elongate mixing blades in their spaced relationship. The exhaust mixer support 130 may be in the form of a tubular member, which may be cylindrical and/or may be shaped to conform to the shape of the mixing conduit 75. The mounting may be achieved by locating lateral edges 118 of the elongate mixing blades 111-115 in slots 119 formed in a wall of the exhaust mixer support 130. A fixative, for example a weld, may be applied between the lateral edges of the elongate mixing blades 111-115 and the exhaust mixer support 130 to retain one to the other. The exhaust mixer support 130 may be mounted within, or form a part of, the inner body 81 of the mixing conduit 75 at or towards the second end 86 thereof. A longitudinal axis of each elongate mixing blade 111-115 may extend substantially parallel to an intended flow direction of an exhaust fluid passing through the exhaust mixer 100, in use.

Instead of a cylindrical exhaust mixer support 130 as shown in FIG. 6, alternative support means may be used. For example, a support frame may be used formed from a plurality of ring members which may be welded to the elongate mixing blades 111-115 at spaced intervals along the longitudinal axis of the elongate mixing blades 111-115. The ring members may then be welded to the inner body 81 of the mixing conduit 75.

As shown in FIG. 7, the plurality of elongate mixing blades 111-115 may comprise five elongate mixing blades 111-115. Each elongate mixing blade 111-115 has a longitudinal axis which extends along the longitudinal axis 120 of the mixing conduit 75. Each elongate mixing blade 111-115 may comprise a leading edge 111a-115a facing upstream towards the injector module 16 and a trailing edge 111b-115b facing downstream. In between, each elongate mixing blade 111-115 may have the form of a plate-like body 111c-115c, wherein the plate-like body may extend along the longitudinal axis 120 of the mixing conduit 75. The plate-like body 111c-115c of at least some of the elongate mixing blades 111-115 may comprise a central section 116 and a wing section 117 on each side of the central section 116 wherein each wing section 117 may be upturned relative to the central section 116 at a slight angle, which may be between 10° and 20°. In one example, as illustrated, the angle is 15°.

One or more of the elongate mixing blades 111-115 may comprise one or more flaps, 131, 132 extending at an angle to its plate-like body 111c-115c. As shown in FIG. 6, the flaps 131, 132 may be located in one of two stages of the exhaust mixer 100. The flaps 132 may be provided in a pre-mixing stage 135 of the exhaust mixer 100, whereas the flaps 131 may be provided in a mixing stage 136 of the exhaust mixer 100. The pre-mixing stage 135 may be located closer to the injector module 16 than the mixing stage 136.

Unless stated otherwise below, each flap 131, 132 may extend relative to its relevant plate-like body at an angle of between 30 and 60°. The flaps 131 may extend in one example at 45°. The flaps 132 may extend in one example at 30°. The flaps 131, 132 may extend above or below the plate-like body.

The flaps 132 of the pre-mixing stage 135 may be upstream-directed flaps, i.e. they may extend at an angle to the plate-like body so as to point generally upstream towards the location of the injector module 16. In contrast, the flaps 131 of the mixing stage 136 may be downstream-directed flaps i.e. flaps which may extend relative to the plate-like body so as to point generally downstream and away from the location of the injector module 16.

As shown in FIGS. 7 and 8, the downstream-directed flaps 131 may all extend only from trailing edges 111b-115b of the elongate mixing blades 111-115. By contrast, the upstream-directed flaps 132 may be located in an intermediate portion of the plate-like bodies 111c-115c so as to be at a distance from both the leading edges 111a-115a and trailing edges 111b-115b.

As shown most clearly in FIG. 7, a first elongate mixing blade 111 of the stacked configuration of elongate mixing blades and a fifth elongate mixing blade 115 of the stacked configuration of elongate mixing blades, which may be the last elongate mixing blade, may be longer than a second, third and fourth elongate mixing blade 112-114. The first elongate mixing blade 111 and fifth elongate mixing blade 115 may define an outermost pair of elongate mixing blades of the stacked configuration which sandwich the second, third and fourth elongate mixing blades 112-114, which may form interior elongate mixing blades.

The first elongate mixing blade 111 may be the longest elongate mixing blade of the stacked configuration. The fifth elongate mixing blade 115 may be the second-longest elongate mixing blade of the stacked configuration.

The first elongate mixing blade 111 may comprise no upstream-directed flaps 132 and a single downstream-directed flap 131 which may extend from the central section 116 of the trailing edge 111b. The downstream-directed flap 131 may be angled at 15° to the plate-like body 111c so as to point towards the longitudinal axis 120.

The second elongate mixing blade 112 may be located adjacent the first elongate mixing blade 111. The second elongate mixing blade 112 comprise no upstream-directed flaps 132 and three downstream-directed flaps 131. The downstream-directed flaps 131 may be angled at 45° to the plate-like body 112c. One of the downstream-directed flaps 131 may extend from the central section 116 of the trailing edge 112b so as to point away from the first elongate mixing blade 111. The other two downstream-directed flaps 131 may extend from the wing sections 117 of the trailing edge 112b so as to point towards the first elongate mixing blade 111.

The third elongate mixing blade 113 may be located adjacent the second elongate mixing blade 112. The third elongate mixing blade 113 may comprise two upstream-directed flaps 132 and three downstream-directed flaps 131. The downstream-directed flaps 131 may be angled at 45° to the plate-like body 113c. One of the downstream-directed flaps 131 may extend from the central section 116 of the trailing edge 113b so as to point away from the second elongate mixing blade 112. The other two downstream-directed flaps 131 may extend from the wing sections 117 of the trailing edge 113b so as to point towards the second elongate mixing blade 112. The two upstream-directed flaps 132 may be angled at 30° to the plate-like body 113c so as to extend from the central section 116 of the plate-like body 113c so as to point towards the second elongate mixing blade 112.

The fourth elongate mixing blade 114 may be located adjacent the third elongate mixing blade 113. The fourth elongate mixing blade 114 may comprise two upstream-directed flaps 132 and three downstream-directed flaps 131. The downstream-directed flaps 131 may be angled at 45° to the plate-like body 114c. One of the downstream-directed flaps 131 may extend from the central section 116 of the trailing edge 114b so as to point away from the third elongate mixing blade 113. The other two downstream-directed flaps 131 may extend from the wing sections 117 of the trailing edge 114b so as to point towards the third elongate mixing blade 113. The two upstream-directed flaps 132 may be angled at 30° to the plate-like body 114c so as to extend from the central section 116 of the plate-like body 114c so as to point away from the third elongate mixing blade 113.

The fifth elongate mixing blade 115 may be located adjacent the fourth elongate mixing blade 114. The fifth elongate mixing blade 115 may comprise two upstream-directed flaps 132 and no downstream-directed flaps 131. The two upstream-directed flaps 132 may be angled at 45° to the plate-like body 115c so as to extend from the central section 116 of the plate-like body 115c so as to point away from the fourth elongate mixing blade 114.

As shown in FIG. 4, when assembled with the mixing conduit 75, the first elongate mixing blade 111 may extend beyond the second end 83 of the mixing conduit 75 into the second opening 62 of the second support member 60. This may locate the leading edge 111a of the first elongate mixing blade 111 relatively close to the injector module 16, the benefit of which will be discussed below.

The second end coupling 25 may provide a fluid flow path from the first end 21 of the second conduit to the first end 31 of the third conduit 30.

In use, fluid, for example exhaust gases, may be supplied to the emissions cleaning module 1 via an inlet 4 as shown in FIG. 3. Fluid may pass into the DOC module 71 in the first portion of the first conduit 10. Prior to receipt at the inlet 4, the pressure of the fluid may be controlled by a back pressure valve and/or a turbocharger waste gate.

The DOC module 71 may comprise one or more catalysts, such as palladium or platinum. These materials serve as catalysts to cause oxidation of hydrocarbons ([) and carbon monoxide (CO) present in the fluid flow in order to produce carbon dioxide ($CO_2$) and water ($H_2O$). The catalysts may be distributed in a manner so as to maximise the surface area of catalyst material in order to increase effectiveness of the catalyst in catalysing reactions.

Fluid may flow from the DOC module 71 to the DPF module 70 which comprises features which are intended to prevent onward passage of carbon (C) in the form of soot. Carbon particles in the fluid may thus be trapped in the filter. The filter may be regenerated through known regeneration techniques. These techniques may involve controlling one or more of the temperature of the fluid, the pressure of the fluid and the proportion of unburnt fuel in the fluid. It will be appreciated by the skilled addressee that the exhaust mixer of the present disclosure may be provided in an emissions cleaning module not having a DOC and/or a DPF.

Fluid may pass from the DOC module 71 past the injector module 16 located within the first end coupling 15. The injector module 16 may be associated with or attachable to a pump electronic tank unit (PETU). The pump electronic tank unit may comprise a tank for providing a reservoir for additive fluid to be injected by the injector. Such additive fluids may include urea or ammonia.

The PETU may further comprise a controller configured to control a volume of additive fluid to be injected from the tank by the injector. The controller may have as inputs, for example, temperature information and quantity of NOx information which may be derived from sensors in the SCR module.

Fluid may pass the injector module 16 where it may receive the injected additive fluid and the resultant mixture of exhaust fluid and additive fluid then passes into the mixing conduit 75 via the inlet 90. As shown in FIG. 4, the injected additive fluid may be injected as a spray having a substantially conical spray pattern 121.

The mixture of exhaust fluid and additive fluid passes through the exhaust mixer 100. The fluid flow may be over and between the elongate mixing blades 111-115 where the flaps 131, 132, may act to turbulently mix the additive fluid with the exhaust fluid which may beneficially promote transfer of heat energy from the exhaust fluid to the additive fluid which may promote decomposition of the urea into ammonia.

The first elongate mixing blade 111 may be elongate and may extend upstream towards the injector module 16, beyond the inlet 90 of the mixing conduit 75, to form a baffle 140, as shown in FIGS. 4 and 6, for preventing or reducing impingement of additive injected from the outlet 16a of the injector module 16 onto a wall of the mixing conduit 75. The fifth elongate mixing blade 115 may extend upstream towards the injector module 16 to form a baffle 141.

Fluids flowing into the mixing conduit 75 may be hot causing thermal expansion of the inner body 81 of the second conduit 20. Any such expansion may be accommodated by relative sliding movement between the first end 85 of the inner body 81 and the first end 82 of the outer body 80. The relative movement may be constrained to be only or mainly a relative axial movement. The overlap between the inner body 81 and the outer body 80 at the first end 21 of the second conduit 20 may be sufficiently great to prevent opening of the air gap 88 during any expansion or contraction of the inner body 81.

Fluid may then pass via outlet 91 and the second end coupling 25 into the SCR module located in the first portion of the third conduit 30 via the second end coupling 25. The SCR module may comprise one or more catalysts through which the mixture of exhaust fluid and urea/ammonia may flow. As the mixture passes over the surfaces of the catalyst a reaction may occur which converts the ammonia and NOx to diatomic nitrogen ($N_2$) and water ($H_2O$).

Fluid may pass from the SCR module to the AMOX module located in the second portion of the third conduit 30. The AMOX module may comprise an oxidation catalyst which may cause residual ammonia present in the fluid exiting the SCR module to react to produce nitrogen ($N_2$) and water ($H_2O$).

Fluid may pass from the AMOX module to the emissions cleaning module outlet located at the second end of the third conduit 30.

Figure 9:
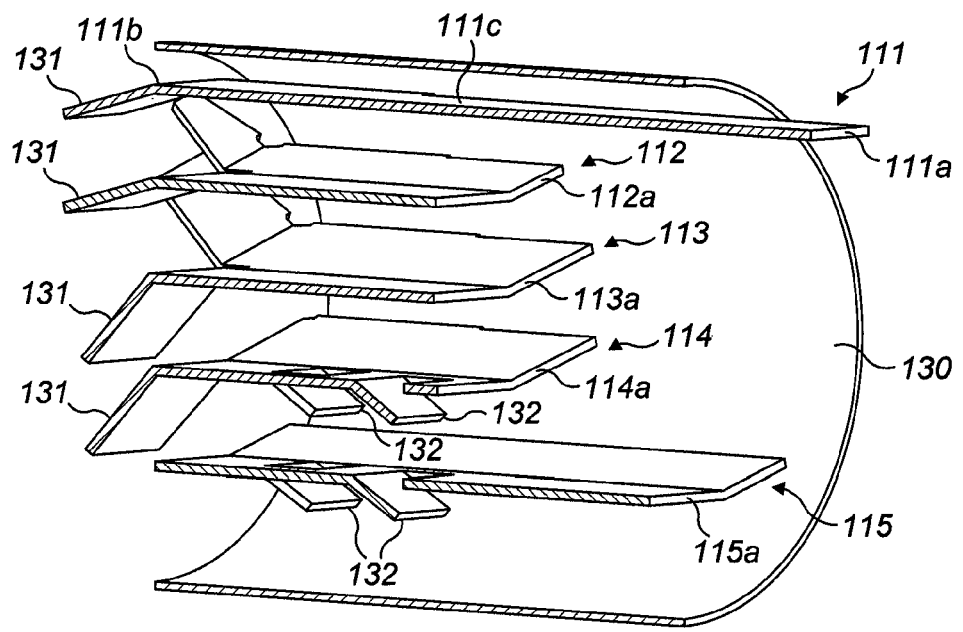
FIG. 9 shows a perspective cross-section of a second embodiment of exhaust mixer according to the present disclosure.

FIG. 9 shows a second embodiment of exhaust mixer 100 according to the present disclosure. Only the differences between the first and second embodiments will now be described. In all other respects the second embodiment may be constructed and function in the same manner as the first embodiment described above.

The exhaust mixer 100 of FIG. 9 may be modified in a first change in that the downstream-directed flap 131 of the second elongate mixing blade 112 extending from the central section 116 is angled at 15° relative to the plate-like body 112c away from the first elongate mixing blade 111. Alternatively, or in addition to the first change, in a second change the third elongate mixing blade 113 may have no upstream-directed flaps 132 in its pre-mixing stage 135. Alternatively, or in addition to the first and/or second changes, in a third change the fourth elongate mixing blade 114 may have no upstream-directed flaps 132 extending from the wing sections 117 of the trailing edge 114b.

Figure 10:
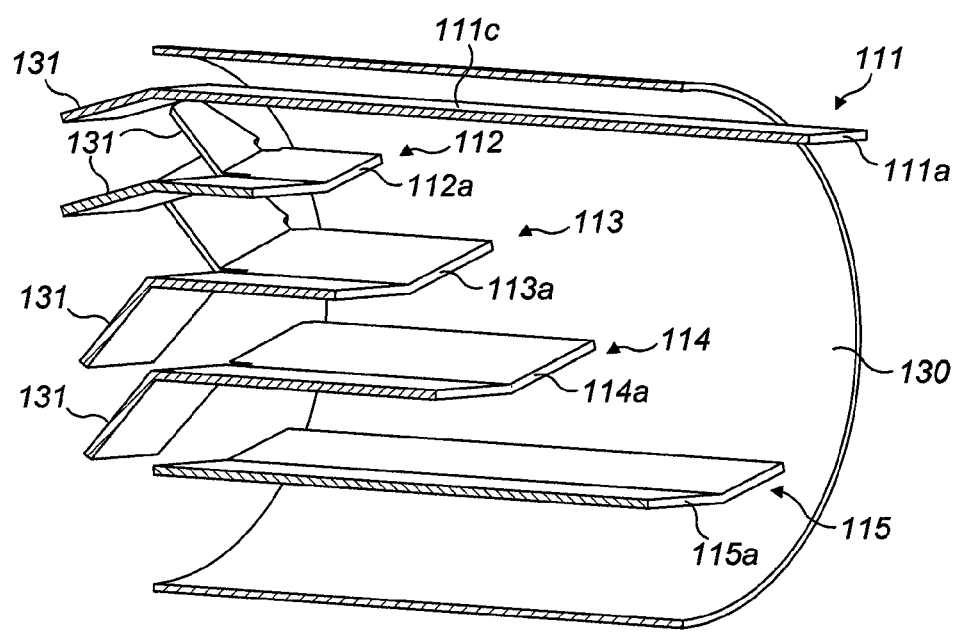
FIG. 10 shows a perspective cross-section of a third embodiment of exhaust mixer according to the present disclosure.

FIG. 10 shows a third embodiment of exhaust mixer 100 according to the present disclosure. Only the differences between the second and third embodiments will now be described. In all other respects the third embodiment may be constructed and function in the same manner as the first and second embodiments described above.

The exhaust mixer 100 of FIG. 10 may be further modified in a first change in that the fourth and/or fifth elongate mixing blades 114, 115 may have no upstream-directed flaps 132 in their pre-mixing stages 135. Alternatively, or in addition to the first change, in a second change the second and/or third elongate mixing blades 112, 113 may be shortened so as to be shorter than the fourth elongate mixing blade 114. The second elongate mixing blade 112 may be shorter than the third elongate mixing blade 113.

Industrial Applicability

The present disclosure provides an exhaust mixer, an emissions cleaning module and a method of mixing an additive into an exhaust fluid which may improve the efficiency of mixing an additive, such as urea, in a flow of exhaust fluid, such as exhaust gas.

Incomplete mixing of the urea, and hence adequate decomposition of the urea to ammonia, when it is injected into the mixing conduit can lead to a build-up of solid urea deposits on the internal surfaces of the mixing conduit, including any exhaust mixer present therein. It has also been found that impingement of the injected additive spray on the relatively cold walls of the mixing conduit can also promote such deposit build-up. This can lead to the need for overly-frequent disassembly and maintenance of the emissions cleaning module.

The exhaust mixer of the present disclosure may result in an increased efficiency of mixing of the injected additive in the exhaust fluid flow. The elongate mixing blades, in particular the first elongate mixing blade, may be particularly advantageous at forming a baffle to prevent direct impingement of injected additive spray on the walls of the mixing conduit.

The arrangement of the present disclosure is also applicable where it may be necessary or advantageous for the injector module to be located upstream of the inlet of the mixing conduit rather than be located laterally relative to the mixing conduit. Locating the injector module upstream of the inlet of the mixing conduit, for example generally in-line with one end of the mixing conduit may lead to a more compact structural arrangement of an emissions cleaning module since it may allow other, parallel, conduits of the emissions cleaning module to be more closely packed against the mixing conduit without the obstruction of the injector module.

The invention claimed is:

1. An exhaust mixer comprising:
   a plurality of elongate mixing blades comprising a plate-like body extending between a leading edge and a trailing edge,
      at least one of the plurality of elongate mixing blades including at least one flap extending at an angle to its plate-like body,
      at least one of the plurality of elongate mixing blades further including a longitudinal axis extending between the leading and trailing edges and at least two flaps extending at an angle to the plate-like body in the central section, the at least two flaps being disposed at different distances laterally from the longitudinal axis,
      the plate-like body of at least one of the plurality of elongate mixing blades including a central section and at least one wing section along a side of and disposed at an angle to the central section along an elongate vertex, said elongate vertex extending parallel to an intended flow direction of an exhaust fluid passing through the exhaust mixer in use;
   a support configured to hold the plurality of elongate mixing blades in a spaced relationship to one another;
   the support disposed in, or forming a part of, at least one of an emissions cleaning module and exhaust conduit.

2. An exhaust mixer as claimed in claim 1 wherein each of the plurality of elongate mixing blades has a longitudinal axis and the support is configured such that the longitudinal axis of each elongate mixing blade extends substantially parallel to the intended flow direction of the exhaust fluid passing through the exhaust mixer, in use.

3. An exhaust mixer as claimed in claim 1 wherein the plate-like body of each elongate mixing blade extends parallel to the intended flow direction of the exhaust fluid passing through the exhaust mixer, in use.

4. An exhaust mixer as claimed in claim 1 wherein the at least one wing section comprises a wing section on each side of the central section, wherein each wing section is upturned relative to the central section.

5. An exhaust mixer as claimed in claim 1 wherein at least one of the at least two flaps is at least one of a downstream-directed flap and an upstream directed flap.

6. An exhaust mixer as claimed in claim 5 wherein the at least one of the at least two flaps extends from the trailing edge of the corresponding elongate mixing blade.

7. An exhaust mixer as claimed in claim 5 wherein the at least one of the at least two flaps is an upstream-directed flap that extends from an intermediate section of the corresponding elongate mixing blade between the leading edge and the trailing edge, wherein the upstream-directed flap forms a pre-mixing stage.

8. An exhaust mixer as claimed in claim 1 which comprises an upstream pre-mixing stage and a downstream mixing stage.

9. An exhaust mixer as claimed in claim 1 wherein the plurality of elongate mixing blades comprises a first elongate mixing blade and a last elongate mixing blade which define an outermost pair of elongate mixing blades of a stacked configuration which sandwich at least one interior elongate mixing blade of a stacked configuration.

10. An exhaust mixer as claimed in claim 9 wherein the first elongate mixing blade is longer than the at least one interior elongate mixing blade.

11. An exhaust mixer as claimed in claim 10 wherein the first elongate mixing blade comprises at least one downstream-directed flap but no upstream directed flaps.

12. An exhaust mixer as claimed in claim 10 wherein the last elongate mixing blade comprises at least one upstream-directed flap but no downstream directed flaps.

13. An exhaust mixer as claimed in claim 1 wherein the plurality of elongate mixing blades comprises a first elongate mixing blade that extends upstream, beyond an inlet end of the support, to form a baffle.

14. An exhaust mixer as claimed in claim 1 wherein the plurality of elongate mixing blades are connected to the support by welds extending along at least one lateral edge of the plurality of elongate mixing blades.

15. An exhaust mixer as claimed in claim 1 wherein the support is shaped to conform to a portion of an emissions cleaning module in which it is intended to be mounted.

16. An emissions cleaning module comprising an exhaust mixer as claimed in claim 1.

17. A method of mixing an additive into an exhaust fluid comprising the steps of:
passing a flow of exhaust fluid along a mixing conduit having an inlet, an outlet and a longitudinal axis;
injecting into the flow of exhaust fluid an additive spray from an injector module; and
passing the flow of exhaust fluid and additive spray through an exhaust mixer located at least partially within the mixing conduit;
wherein the exhaust mixer comprises a plurality of elongate mixing blades arranged in a spaced arrangement for turbulently mixing the additive spray with the exhaust fluid, each of the plurality of elongate mixing blades comprising a plate-like body extending between a leading edge and a trailing edge, and a longitudinal axis extending along a plane including the longitudinal axis of the mixing conduit,
at least one of the plurality of elongate mixing blades including at least one flap extending at an angle to its plate-like body,
at least one of the plurality of elongate mixing blades further including a longitudinal axis extending between the leading and trailing edges and at least two flaps extending at an angle to the plate-like body in the central section, the at least two flaps being disposed at different distances laterally from the corresponding longitudinal axis,
the plate-like body of at least one of the plurality of elongate mixing blades including a central section and at least one wing section along a side of and disposed at an angle to the central section along an elongate vertex said elongate vertex extending parallel to the flow direction of exhaust fluid passing through the exhaust mixer;
wherein the additive spray is injected into the inlet of the mixing conduit by the injector module.

* * * * *